(12) United States Patent
Zhong et al.

(10) Patent No.: US 9,070,719 B2
(45) Date of Patent: Jun. 30, 2015

(54) SEMICONDUCTOR DEVICE STRUCTURE, METHOD FOR MANUFACTURING THE SAME, AND METHOD FOR MANUFACTURING FIN

(75) Inventors: Huicai Zhong, San Jose, CA (US); Qingqing Liang, Lagrangeville, NY (US); Jun Luo, Beijing (CN); Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 357 days.

(21) Appl. No.: 13/577,942

(22) PCT Filed: Nov. 18, 2011

(86) PCT No.: PCT/CN2011/082420

§ 371 (c)(1),
(2), (4) Date: Aug. 9, 2012

(87) PCT Pub. No.: WO2013/026236

PCT Pub. Date: Feb. 28, 2013

(65) Prior Publication Data

US 2013/0062708 A1    Mar. 14, 2013

(30) Foreign Application Priority Data

Aug. 22, 2011    (CN) .......................... 2011 1 0240931

(51) Int. Cl.
*H01L 21/762*    (2006.01)
*H01L 21/336*    (2006.01)
(Continued)

(52) U.S. Cl.
CPC .. *H01L 29/66795* (2013.01); *H01L 21/823481* (2013.01); *H01L 21/823878* (2013.01);
(Continued)

(58) Field of Classification Search
CPC .............. H01L 29/785; H01L 29/7855; H01L 29/66795; H01L 29/41791; H01L 21/845; H01L 21/823431; H01L 27/1211; H01L 27/0886; H01L 21/823878; H01L 21/823821; H01L 21/823481; H01L 29/0649
See application file for complete search history.

(56) References Cited

U.S. PATENT DOCUMENTS

2005/0250285 A1* 11/2005 Yoon et al. .................... 438/283
2005/0269629 A1* 12/2005 Lee et al. ...................... 257/327
(Continued)

FOREIGN PATENT DOCUMENTS

CN         1988160 A      6/2007
CN       100590876 C      2/2010
(Continued)

OTHER PUBLICATIONS

Search Report (PCT/ISA/210), dated May 31, 2012.
(Continued)

*Primary Examiner* — Marvin Payen
*Assistant Examiner* — Jeremy Joy
(74) *Attorney, Agent, or Firm* — Westman, Champlin & Koehler, P.A.

(57) ABSTRACT

A semiconductor device structure, a method for manufacturing the same, and a method for manufacturing a semiconductor fin are disclosed. In one embodiment, the method for manufacturing the semiconductor device structure comprises: forming a fin in a first direction on a semiconductor substrate; forming a gate line in a second direction, the second direction crossing the first direction on the semiconductor substrate, and the gate line intersecting the fin with a gate dielectric layer sandwiched between the gate line and the fin; forming a dielectric spacer surrounding the gate line; and performing inter-device electrical isolation at a predetermined position, wherein isolated portions of the gate line form independent gate electrodes of respective devices.

13 Claims, 16 Drawing Sheets

(51) Int. Cl.
*H01L 29/78* (2006.01)
*H01L 29/66* (2006.01)
*H01L 21/8234* (2006.01)
*H01L 21/8238* (2006.01)
*H01L 29/06* (2006.01)
*H01L 21/84* (2006.01)

(52) U.S. Cl.
CPC .... *H01L21/823821* (2013.01); *H01L 29/0649* (2013.01); *H01L 29/66545* (2013.01); *H01L 29/785* (2013.01); *H01L 21/823431* (2013.01); *H01L 21/845* (2013.01)

(56) References Cited

U.S. PATENT DOCUMENTS

| | | | |
|---|---|---|---|
| 2007/0141781 A1* | 6/2007 | Park et al. | 438/257 |
| 2009/0014798 A1* | 1/2009 | Zhu et al. | 257/351 |
| 2009/0101968 A1 | 4/2009 | Sugioka | |
| 2009/0127626 A1* | 5/2009 | Zhu et al. | 257/368 |
| 2010/0025767 A1 | 2/2010 | Inaba | 257/365 |
| 2010/0041198 A1* | 2/2010 | Zhu et al. | 438/283 |
| 2010/0081240 A1* | 4/2010 | Yagishita | 438/151 |
| 2011/0020987 A1* | 1/2011 | Hareland et al. | 438/151 |
| 2011/0147848 A1 | 6/2011 | Kuhn et al. | 257/368 |
| 2011/0175166 A1 | 7/2011 | Bedell et al. | |
| 2013/0026571 A1* | 1/2013 | Kawa et al. | 257/347 |
| 2013/0200458 A1* | 8/2013 | Anderson et al. | 257/347 |

FOREIGN PATENT DOCUMENTS

| | | |
|---|---|---|
| CN | 101840921 A | 9/2010 |
| CN | 102157555 A | 8/2011 |

OTHER PUBLICATIONS

Written Opinion (PCT/ISA/237), dated May 21, 2012.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

SEMICONDUCTOR DEVICE STRUCTURE, METHOD FOR MANUFACTURING THE SAME, AND METHOD FOR MANUFACTURING FIN

CROSS-REFERENCE TO RELATED APPLICATION

This Application is a Section 371 National Stage Application of International Application No. PCT/CN2011/082420, filed Nov. 18, 2011, not yet published, which claimed priority to Chinese Application No. 201110240931.5, filed on Aug. 22, 2011; both the PCT Application and Chinese Application are incorporated herein by reference in their entireties.

TECHNICAL FIELD

The present disclosure relates to the semiconductor field, and more particularly, to a semiconductor device structure having a fin and a method for manufacturing the same where a high quality gate pattern can be obtained, and also to a method for manufacturing a semiconductor fin where a high quality semiconductor fin pattern can be obtained.

BACKGROUND

As the integration density is continuously increasing, fin transistor structures such as Fin Field Effect Transistors (FinFETs) are attracting more attentions due to their good electrical characteristics, scalability, and compatibility with the conventional manufacture processes. FIG. 1(a) is a perspective view showing a FinFET by way of example. As shown in FIG. 1(a), the FinFET comprises: a bulk Si semiconductor substrate 101; a fin 102 formed on the bulk Si semiconductor substrate 101; a gate electrode 103 intersecting the fin 102, with a gate dielectric layer 104 disposed therebetween; and an isolation region 105 (for example, $SiO_2$). In this FinFET, conductive channels will be created in the fin 102, specifically, in the three surfaces of the fin 102 (i.e., the left and right side walls and the top surface shown in the figure) under control of the gate electrode 103, as shown by arrows in FIG. 1(a). That is, portions of the fin 102 underlying the gate electrode 103 serve as a channel region, and source and drain regions are located on opposite sides of the channel region.

In the example shown in FIG. 1(a), the FinFET is formed on the bulk semiconductor substrate. However, a FinFET can also be formed on a substrate in other forms such as a Semiconductor On Insulator (SOI) substrate. Further, the FET shown in FIG. 1(a) is termed as a tri-gate FET because the three surfaces of the fin 102 all can have the channels created therein. For example, a 2-gate FET can be formed by disposing an isolation layer (for example, nitride) between the top wall of the fin 102 and the gate electrode 103, and in this case, no channel will be created in the top wall of the fin 102.

Furthermore, in order to improve the driving capability so as to further improve the performance, it is possible to connect several fins together to form a single device. Referring to FIG. 1(b), three fins 102a, 102b, and 102c are controlled by one gate electrode 103, and they may be connected to one source and one drain (not shown in the figure). As a result, the FinFET shown in FIG. 1(b) has a significantly improved current driving capability. Other reference numerals shown in FIG. 1(b) are the same as those corresponding ones shown in FIG. 1(a). FIG. 2 is a photo showing a profile of fins 102 and gate electrodes 103 in an actual FinFET.

However, as device feature sizes are becoming smaller continuously, it is more difficult to make gate electrodes for the fin transistors. In view of this, there is a need for a novel semiconductor device structure having a fin and a method for manufacturing the same.

SUMMARY

The present disclosure provides, among other things, a semiconductor device structure and a method for manufacturing the same, to overcome, at least in part, the problems in the conventional processes as described above.

According to an embodiment, there is provided a method for manufacturing a semiconductor device structure, comprising: forming a fin in a first direction on a semiconductor substrate; forming a gate line in a second direction, the second direction crossing the first direction on the semiconductor substrate, and the gate line intersecting the fin with a gate dielectric layer sandwiched between the gate line and the fin; forming a dielectric spacer surrounding the gate line; and performing inter-device electrical isolation at a predetermined position, wherein isolated portions of the gate line form independent gate electrodes of respective devices.

According to a further embodiment, there is provided a semiconductor device structure, comprising: a semiconductor substrate; and a plurality of devices formed on the semiconductor substrate. Here, each of the devices may comprise: a fin extending in a first direction; a gate electrode extending in a second direction, the second direction crossing the first direction, and the gate electrode intersecting the fin with a gate dielectric layer sandwiched between the gate line and the fin; and dielectric spacers on opposite lateral outer sides of the gate electrode. Here, the gate electrodes of respective devices adjacent to each other in the second direction may be formed from one gate line extending in the second direction, and the dielectric spacers of the respective devices adjacent to each other in the second direction may be formed from one dielectric spacer layer extending in the second direction. The gate line may comprise a first electrical isolation at a predetermined position between the adjacent devices. The dielectric spacer layer extends only on the outer sides of the continuous gate line.

According to a still further embodiment, there is provided a method for manufacturing semiconductor fins, comprising: providing a semiconductor substrate which has a fin material layer thereon; patterning the fin material layer to form at least one fin line extending in a first direction; and performing electrical isolation on the at least one fin line at a predetermined position in such a manner that the fin line is isolated into the semiconductor fins.

In the present disclosure, the inter-device electrical isolation such as cutting and oxidation is performed after the formation of the dielectric spacer. Therefore, the dielectric spacer will not extend into opposing end faces of respective gate electrodes of adjacent devices. Thus, unlike the conventional processes, there will be no defects such as voids due to the presence of the spacer material in the cuts. As a result, the minimum electrical isolation space between the devices can be reduced, and thus the integration density of the devices can be improved, resulting in reduced manufacture cost.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
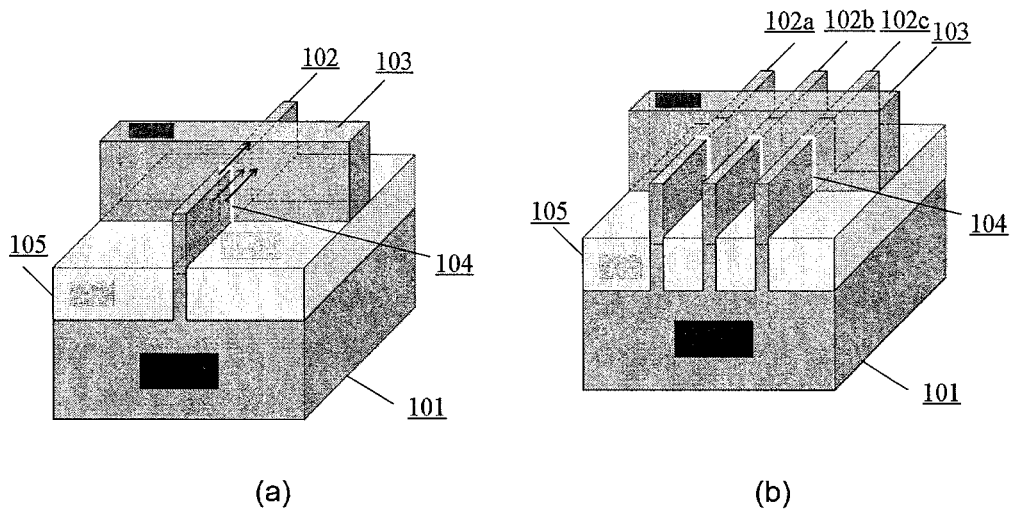
FIG. 1 shows perspective views of FinFETs by way of example.
Figure 2:
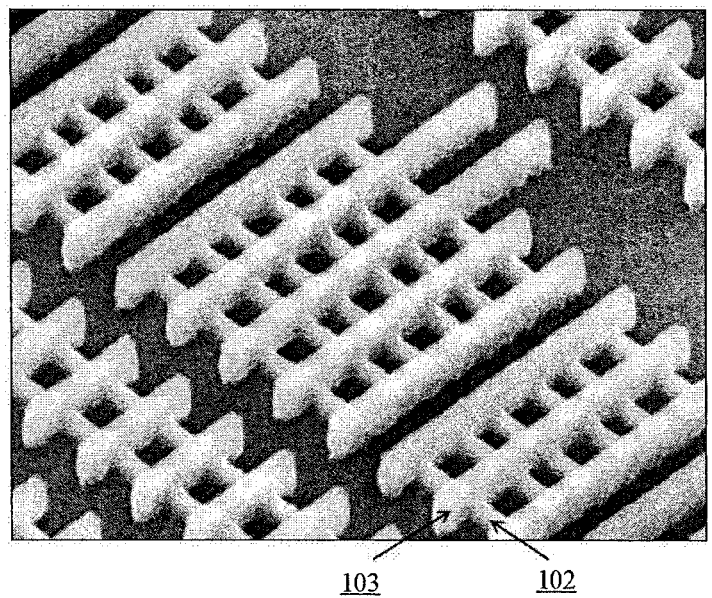
FIG. 2 is a photo showing a profile of fins and gate electrodes in an actual FinFET.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are shown. However, they are not drawn to scale, and some features may be enlarged while some features may be omitted for sake of clarity. Moreover, shapes, sizes, and relative positions of regions and layers shown in the drawings are also illustrative, and deviations may occur due to manufacture tolerances and technique limitations in practice. Those skilled in the art can also devise regions/layers of other different shapes, sizes, and relative positions as desired.

First, a conventional process for making gate stacks for a FinFET is described in brief.

Figure 3:
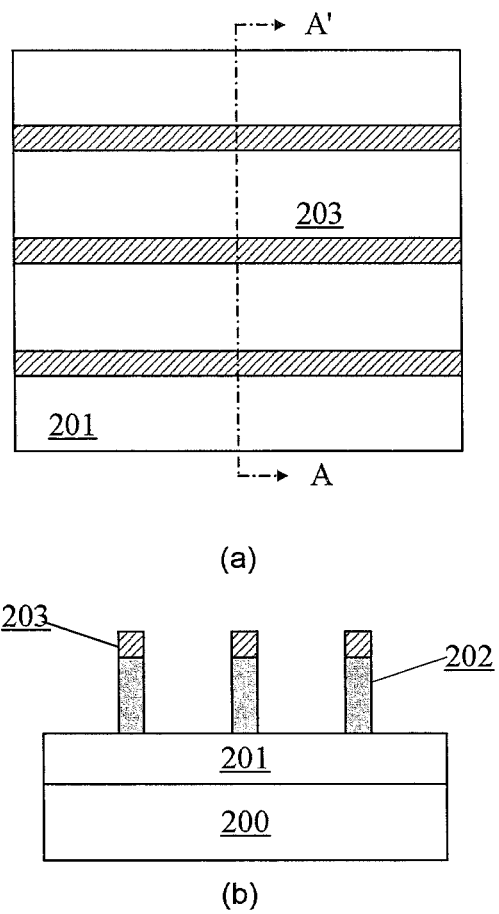
FIG. 3 is a diagram schematically showing a conventional process for making a fin for a FinFET, wherein (a) is a top view, and (b) is a sectional view taken along line A-A' in (a)

As shown in FIG. 3, firstly, fins are formed on a semiconductor substrate. In the example shown in FIG. 3, the semiconductor substrate is an SOI substrate, including two Si layers 200 and 202 and a $SiO_2$ layer 201 interposed therebetween. The Si layer 202 is etched through a patterned hard mask layer 203 (for example, $Si_3N_4$) serving as a mask, to form the fins. In this example, the semiconductor substrate comprises Si and the fins are also made of the semiconductor material Si. However, those skilled in the art will understand that the semiconductor substrate and/or the fins may comprise any suitable semiconductor material, such as Ge, GaN, InP, and the like. In the following, the descriptions are given also in conjunction with a SOI substrate by way of example, but the present invention is not limited thereto.

The hard mask layer 203 may be removed. Thus, a gate electrode, which will be made subsequently, will be coupled to three surfaces of a respective one of the fins 202 with a gate dielectric layer sandwiched between the gate electrode and the fin, resulting in a tri-gate FET. Or alternatively, the hard mask layer 203 may be reserved, so that a gate electrode, which will be made subsequently, will be coupled to only two surfaces of a respective one of the fins 202 with a gate dielectric layer sandwiched between the gate electrode and the fin (the top surface thereof will not have a channel created therein under the control of the gate electrode due to the presence of the hard mask layer 203), resulting in a 2-gate FET.

Hereinafter, the descriptions are given also in conjunction with a tri-gate FET by way of example. However, those skilled in the art will appreciate that the present disclosure is also applicable to a 2-gate FET as well as other semiconductor device structure having a fin.

Figure 4:
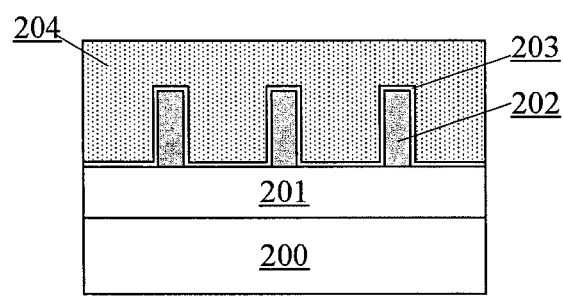
FIG. 4 is a diagram schematically showing a structure obtained after forming a gate dielectric layer and a gate electrode layer on the structure shown in FIG. 3.

Next, as shown in FIG. 4, a gate dielectric layer 203 (for example, a high-K gate dielectric layer) and a gate electrode layer 204 (for example, a metal gate electrode layer) are formed sequentially on the semiconductor substrate having the fins formed thereon. Then, the gate dielectric layer 203 and the gate electrode layer 204 are patterned to form the final gate stacks.

Specifically, as shown in FIG. 5(a), the semiconductor substrate is shown in a top view. The semiconductor substrate has a pattern of the fins 202 formed thereon, as shown in FIG. 4. Here, it should be noted that FIG. 4 only shows a portion of the structure shown in FIG. 5(a) and thus appears differently from FIG. 5(a). Further, the semiconductor substrate also have the gate dielectric layer 203 and the gate electrode layer 204 formed thereon. However, for sake of clarity, the gate dielectric layer 203 and the gate electrode layer 204 are not shown in the top view (this is also true for the following top views). In this structure, a pattern of photoresist lines 205, corresponding to a pattern of gate lines to be formed, is printed by coating a photoresist layer, exposing the resist through a mask, and then developing the resist. The respective lines of the pattern 205 are printed in parallel in a single direction and have the same or similar pitches and critical dimensions.

In FIG. 5(b), only two lines 205 in the sectional view along line A-A' are shown for sake of clarity. This is also true for the following sectional views.

Figure 6:
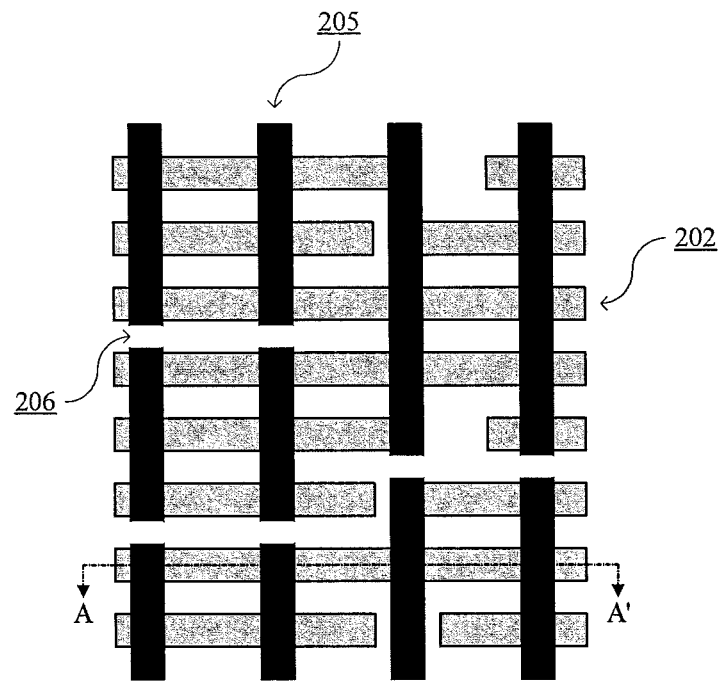
Figure 6:
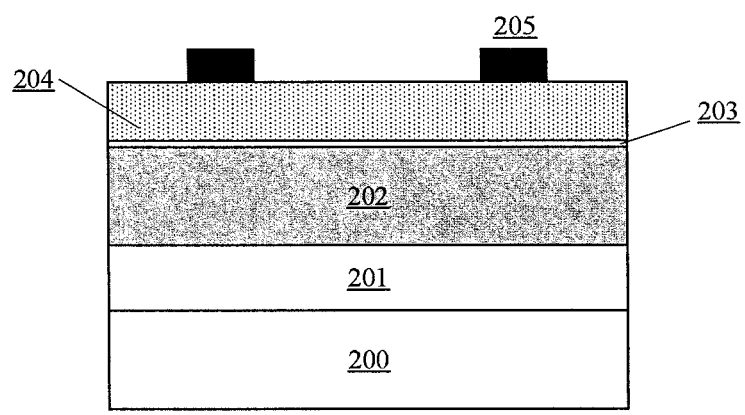

Next, as shown in FIG. 6, cuts 206 are formed in the pattern of lines 205 by a further exposure through a cut mask and then development. Thus, in the pattern 205, gate patterns corresponding to different devices are separated from one another.

Figure 7:
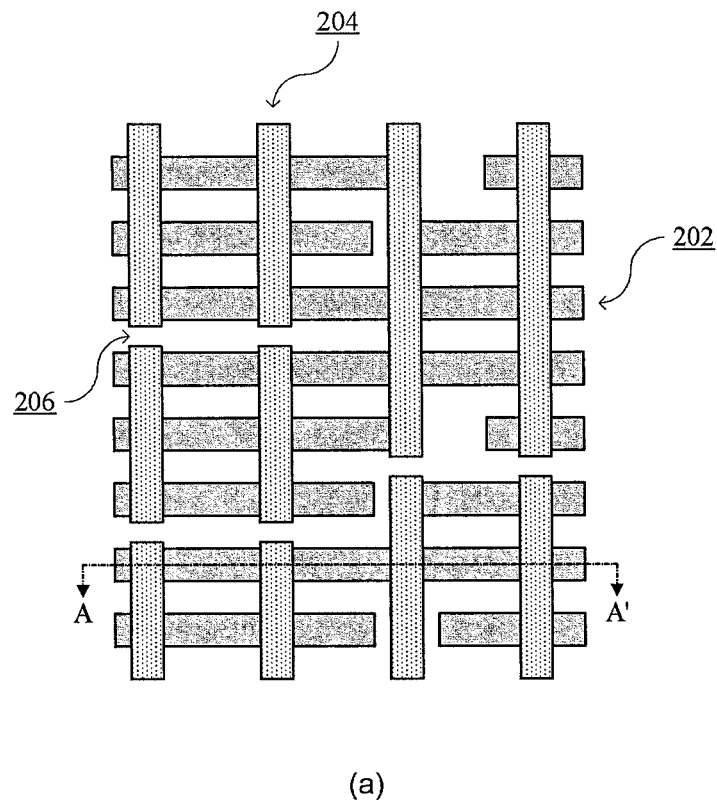
Figure 7:
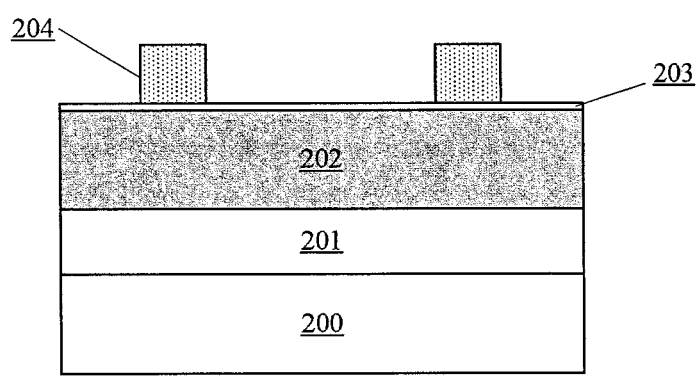

Finally, etching is carried out with the photoresist pattern 205 having the cuts 206 formed therein to achieve gate stacks corresponding to this pattern. FIG. 7 shows gate electrodes 204 formed by the etching. Here, it should be noted that in the example shown in FIG. 7 the gate dielectric layer 203 has not been etched. However, those skilled in the art will understand that the gate dielectric layer 203 can be also etched following the etching of the gate electrode layer 204.

Figure 5:
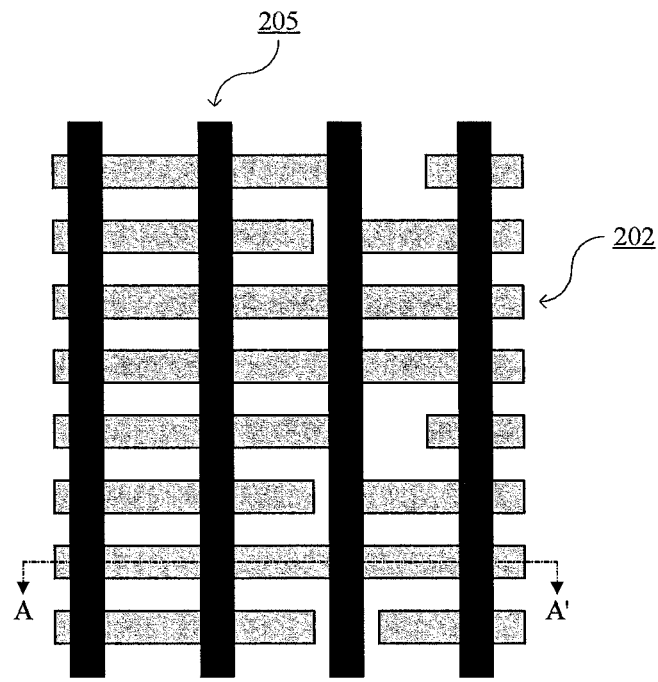
FIGS. 5-7 are diagrams schematically showing a conventional process for pattering gate stacks for a FinFET, wherein (a) is a top view, (b) is a sectional view taken along line A-A' in (a)
Figure 5:
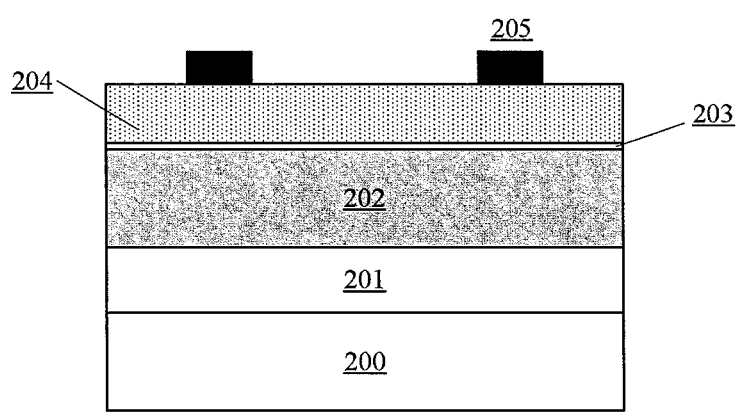

Alternatively, a first etching can be carried out after the pattern of lines 205 is printed as shown in FIG. 5, so as to form parallel gate lines; and then, a second etching can be carried out using the cut mask, so as to form cuts in the parallel gate lines.

In the above process, a single exposure for forming the gate patterns is divided into two exposures: one for exposing the pattern of lines 205, and the other for exposing the cuts 206. As a result, it is possible to reduce the demand for the photolithography and improve the line width control in the photolithography. Further, it is possible to eliminate many proximity effects.

Figure 8:
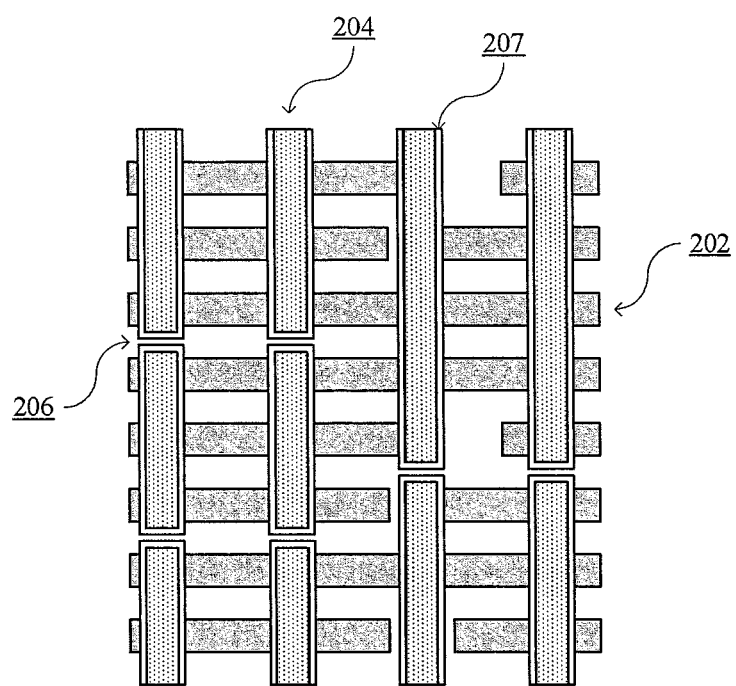
FIG. 8 is a diagram schematically showing a gate electrode and a gate spacer surrounding the gate electrode as a result of the conventional process.

However, with the continuously decreasing of the device feature sizes, the above conventional process is encountering more and more challenges. According to the conventional process, after the cuts are formed, processes such as dielectric spacer formation should be performed. Referring to FIG. 8, dielectric spacers 207 surrounding the respective gate electrodes 204 are shown. In FIG. 8, for sake of simplification, no spacer is shown at the uppermost and lowermost sides. However, it should be noted that there are also spacers 207 formed at the positions if some gate electrodes 204 terminate at those positions. In one word, the spacers 207 are surrounding the respective gate electrodes 204. Since there are the cuts 206 in the gate patterns, the material of the spacers will enter into the cuts 206. As a result, the cuts in the gate lines will impact the profile of the dielectric spacers. For example, if the cuts in the gate lines are very small (that is, the distance between opposite ends of two neighboring gate electrodes in a line is very small), there may be voids formed in the dielectric within the cuts. These voids will cause defects such as shorts in subsequent processes. Further, the profile of the dielectric spacer material at the positions of the cuts will also significantly impact subsequent CMP processes.

Therefore, the conventional process requires highly precise end to end gaps (between gate electrodes). However, such a requirement makes the Optical Proximity Correction (OPC) become more difficult. Further, designs for the cut mask become more challenging. Especially, in recent years, the replacement gate process is adopted in order to use a high-K gate dielectric/metal gate. The replacement gate process makes the line-and-cut method even more complicated.

The technology disclosed herein is directed at least partially to those problems as describe above.
(First Embodiment)

Next, a first embodiment is described with reference to FIGS. 9-11.

According to the embodiment, after a pattern of photoresist lines is printed as described above with reference to FIG. 5, a pattern of cuts is not immediately formed using a cut mask. Instead, a gate electrode layer is etched directly using the pattern of lines, so as to form parallel gate lines.

Figure 9:
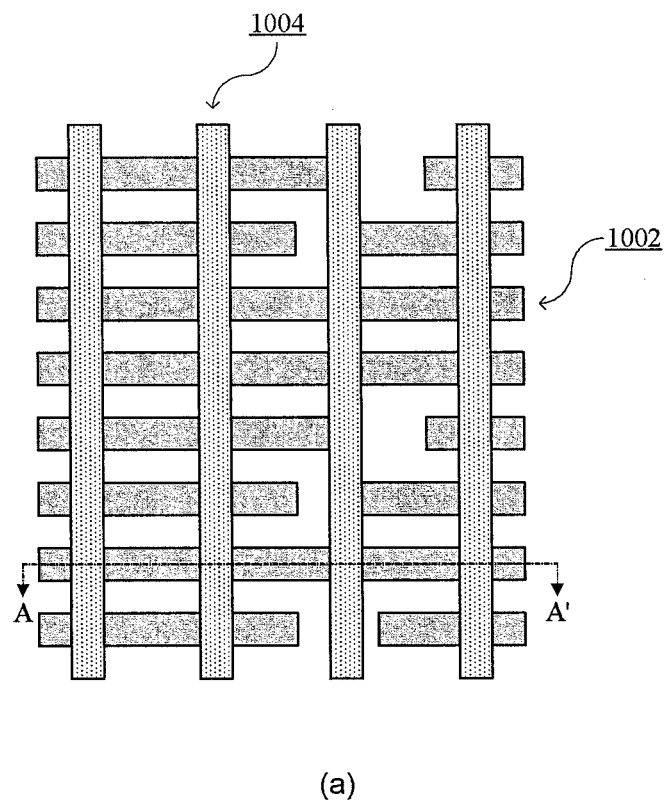
FIG. 9-11 are diagrams schematically showing a process flow for manufacturing a semiconductor device structure according to a first embodiment of the present disclosure, wherein (a) is a top view, (b) is a sectional view taken along line A-A' in (a)
Figure 9:
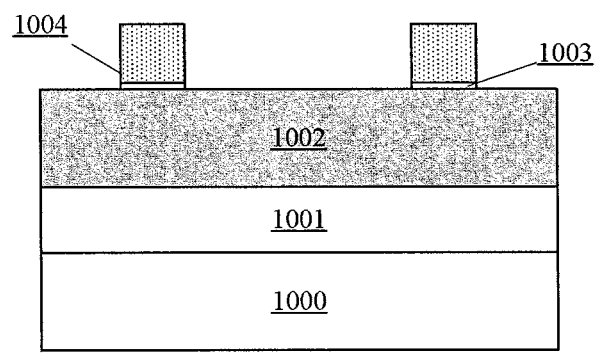

Specifically, as shown in FIG. 9, on a SOI substrate (including two Si layers 1000 and 1002 and a SiO$_2$ layer 1001 interposed therebetween), fins 1002 are formed, and then a gate dielectric layer 1003 and a gate electrode layer 1004 are sequentially formed. Next, a pattern of photoresist lines corresponding to a pattern of gate lines to be formed is printed. The respective lines in the pattern of photoresist lines are printed in parallel in a single direction (referring to the above descriptions in conjunction with FIG. 5). Those parallel lines may have different pitches and/or different widths.

After the pattern of lines is formed, a pattern of cuts is not immediately formed using a cut mask. Instead, the gate electrode layer is etched directly using the pattern of lines, so as to form parallel gate lines 1004. Here, the gate dielectric layer 1003 is also etched, so that only potions of the gate dielectric layer 1003 underneath the gate lines 1004 are remained, as shown in FIG. 9(b).

The gate dielectric layer 1003 may comprise, for example, ordinary dielectric materials such as SiO$_2$, high-K dielectric materials such as one or more selected from HfO$_2$, HfSiO, HfSiON, HfTaO, HfTiO, HfZrO, Al$_2$O$_3$, La$_2$O$_3$, ZrO$_2$, and LaAlO, or the like. The gate electrode layer 1004 may comprise, for example, poly silicon, metal materials such as Ti, Co, Ni, Al, and W or any alloy thereof, metal nitride, or the like.

After the gate lines 1004 are formed, conventional processes may be conducted in order to manufacture semiconductor devices such as transistors. For example, processes such as ion implantation (to perform doping so as to form, for example, sources/drains), spacer formation, silicidation, and dual stress liner integration, may be carried out. Here, it should be noted that those specific processes (for example, ion implantation, silicidation, etc.) for forming the semiconductor devices are not directly relevant to the present disclosure, and thus will not be described in detail here. They may be implemented by conventional processes or by future developed processes, and the present invention is not limited thereto. In the following, only the spacer formation according to an embodiment will be described in detail.

Figure 10:
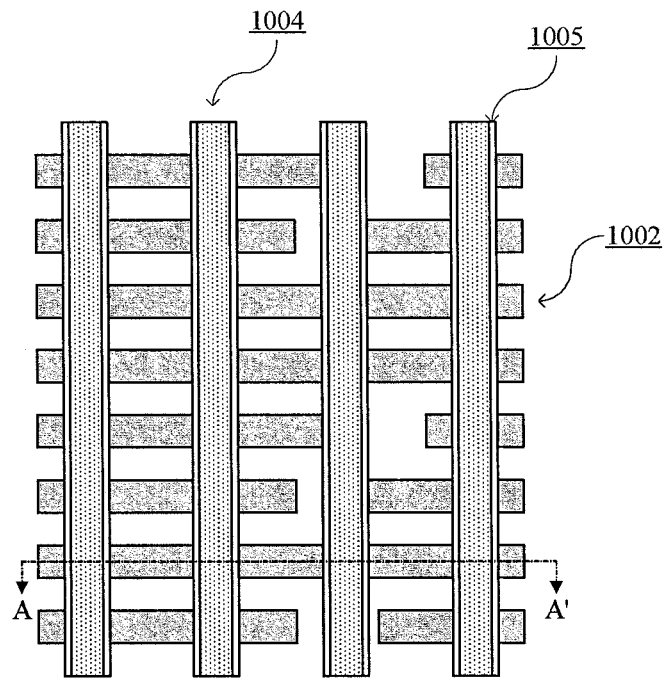
Figure 10:
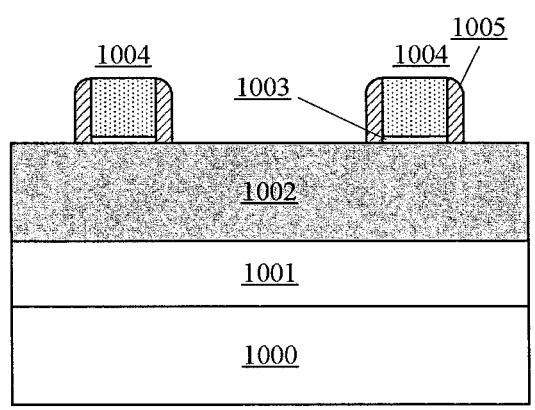

Specifically, as shown in FIG. 10, a dielectric spacer layer 1005 is formed to surround the respective gate lines 1004. For example, the dielectric spacer layer 1005 may be formed by depositing on the entire structure one or more layers of dielectric materials, such as SiO$_2$, Si$_3$N$_4$, SiON, and the like, or any combination thereof, and then conducting Reactive Ion Etching (RIE) thereon. Since there is no cut in the gate lines 1004, the dielectric spacer layer 1005 is formed on opposite lateral outer sides of the respective gate lines 1004 in the horizontal direction of the figure, besides those formed at the ends of the gate lines 1004 in the vertical direction of the gate lines. That is, the dielectric spacer layer 1005 extends only on the outer sides of the respective gate lines 1004. Of course, the dielectric spacer layer may also be formed on the outer sides of the protruding fins, which is not shown in the figure. In the process of manufacturing the device, it is possible to selectively remove the dielectric layer on the outer sides of the protruding fins as desired.

Further, if the gate dielectric layer is not etched in etching the gate lines, then after the dielectric spacer layer 1005 is formed, it is possible to carry out etching along the spacer to remove portions of the gate dielectric layer 1003 located outside the spacer.

Next, an interlayer dielectric layer 1007 (referring to FIG. 11(b)) may be formed on the resultant structure. Generally, the interlayer dielectric layer may comprise nitride such as Si$_3$N$_4$. In this disclosure, optionally, to further improve the device performance, the interlayer dielectric layer may be made of a stressed dielectric material. For example, for a NFET, the interlayer dielectric layer may comprise a tensile-stressed dielectric material; and for a PFET, the interlayer dielectric layer may comprise a compressive-stressed dielectric material.

Figure 11:
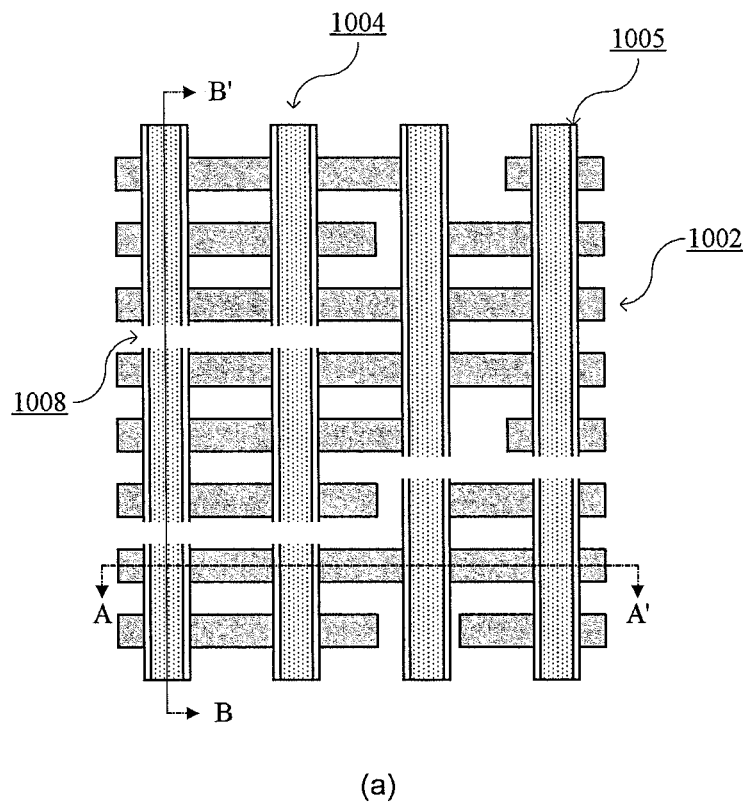
Figure 11:
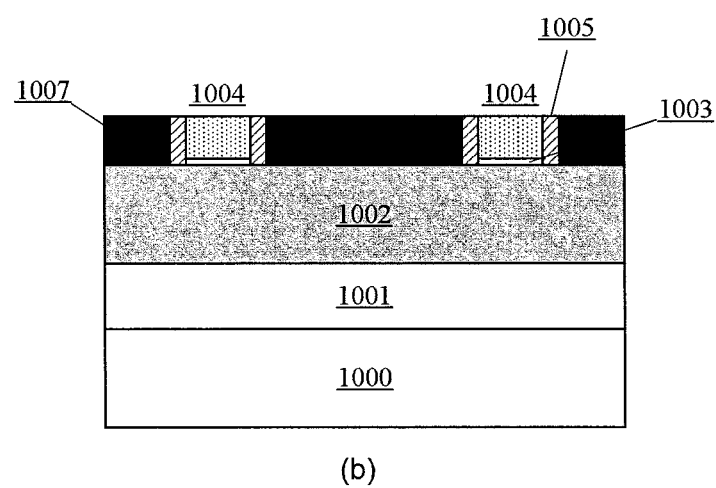

Subsequently, as shown in FIG. 11, the gate lines 1004 and the dielectric spacer layer 1005 are cut off at predetermined positions according to the design, to achieve inter-device electrical isolations (in FIG. 11(a), the interlayer dielectric layer is not shown for clarity). In general, the cuts are made above the non-active regions (i.e. fields) between the respective fins 1002, with a cut width (in the vertical direction of the gate lines) of about 1-10 nm. The cutting may be implemented, for example, by RIE, a laser cutting etch, etc. with the use of a cut mask. For instance, if the cutting is done by means of etching, a photoresist layer may be coated on the substrate and then patterned by the cut mask so that the predetermined positions corresponding to the cuts to be formed are exposed. Then, exposed portions of the gate lines 1004 and the dielectric spacer layer 1005 surrounding the respective gate lines are cut off, so as to form the cuts 1008. As a result, the cut gate lines 1004 result in electrically isolated gate electrodes, and the cut dielectric spacer layer 1005 results in electrically isolated dielectric spacers. The cuts 1008 may be filled with a further interlayer dielectric layer subsequently.

Here, it should be noted that it is also possible not to cut off the dielectric spacer layer 1005 in the above cutting process, because the dielectric spacer layer 1005 is insulating and thus will not impact the inter-device electrical isolations. For example, in the case where the cutting is implemented by means of RIE, the etching may be selectively conducted so that the etching does not impact the dielectric spacer layer 1005 substantially.

Alternatively, in the above process, instead of cutting, oxygen species may be implanted at the cut positions so that the semiconductor material (for example, Si) of the gate lines 1004 is subjected to oxidation and thus is converted to an insulating oxide. As a result, due to the resultant oxide, portions of a respective gate line 1004 on opposing sides of a cut position are electrically isolated from each other (which has an effect equivalent to the cutting) to form electrically isolated gate electrodes. Of course, the implanted species is not limited to oxygen. Those skilled in the art can select appropriate implantation species based on the material used for the gate lines 1004 so that they can react to generate an insulating material and thus achieve the electrical isolations.

Thus, the fabrication of the semiconductor device structure according to this disclosure is substantially finished.

In the above embodiment, the interlayer dielectric layer 1007 is formed before the "cutting" or "isolation" of the gate lines (and optionally, also the dielectric spacer). In this case, the cuts can be filed with a further interlayer dielectric layer which is to be formed subsequently. However, it is also possible to perform the "cutting" or "isolation" of the gate lines (and optionally, also the dielectric spacer) before the formation of the interlayer dielectric layer 1007. In this case, the cuts will be filled with the interlayer dielectric layer 1007.

FIG. 11(b) is a sectional view showing a semiconductor device structure manufactured according to the above described method. In FIG. 11(b), the shown structure has already been subjected to a planarization process such as Chemical Mechanical Polishing (CMP). The planarization process may be carried out immediately after the formation of the interlayer dielectric layer 1007, or may be carried out after the "cutting" or "isolation".

As shown in FIG. 11, the semiconductor device structure comprises a plurality of devices. Each of the devices may comprise: the fin 1002 formed on the semiconductor substrate and extending in a first direction (the horizontal direction in the figure); the gate electrode 1004 extending in a second direction (the vertical direction in the figure) crossing the first direction, the gate electrode 1004 intersecting the fin 1002 with the gate dielectric layer 1003 sandwiched between the gate electrode 1004 and the fin 1002; and the dielectric spacers 1005 formed on the opposite lateral outer sides of the gate electrode. Here, the first direction and the second direction may be orthogonal to each other. In this structure, the opposing gate electrodes and the opposing dielectric spacers of neighboring devices in the gate width direction (that is, the second direction) are formed, respectively, from a single gate line and a single dielectric spacer layer extending in the second direction. The gate line comprises an electrical isolation at the predetermined position, so that the neighboring devices are electrically isolated. The electrical isolation may comprise the cut formed by means of etching, or the insulating material converted from the gate line (for example, the oxide formed by implanting oxygen at the cut position as described above). The cut may have dielectric material(s) filled therein. For example, in a case where the interlayer dielectric layer 1007 is formed after the cutting, the cut may have the material of the interlayer dielectric layer 1007 filled therein. Or alternatively, in a case where the interlayer dielectric layer 1007 is formed before the cutting, the cut may have the material of a subsequently formed interlayer dielectric layer filled therein.

In the present disclosure, the dielectric spacer layer extends on the outer sides of the respective gate lines, so that at the predetermined positions there will be no material of the dielectric spacer existing between opposing end faces of the gate electrodes, unlike the conventional art where the spacer surrounds the respective gate electrodes so that there will be the material of the spacer between the opposing end faces of the gate electrodes.

(Second Embodiment)

The disclosed method is also compatible with the replacement gate process. Hereinafter, a second embodiment is described with reference to FIGS. 12-15, where the replacement gate process is incorporated. That is, a sacrificial gate line is first formed, and then is replaced with a replacement gate line.

In the following, emphasis is given to differences of the second embodiment from the first embodiment and descriptions of the same processes are omitted. Like reference numbers denote like parts throughout the drawings.

Figure 12:
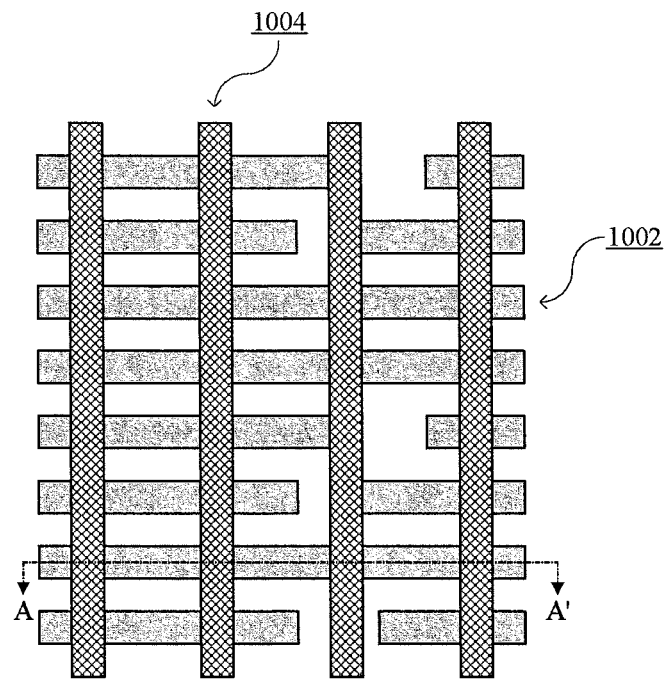
FIGS. 12-15 are diagrams schematically showing a process flow for manufacturing a semiconductor device structure according to a second embodiment of the present disclosure, wherein (a) is a top view, (b) is a sectional view taken along line A-A' in (a)
Figure 12:
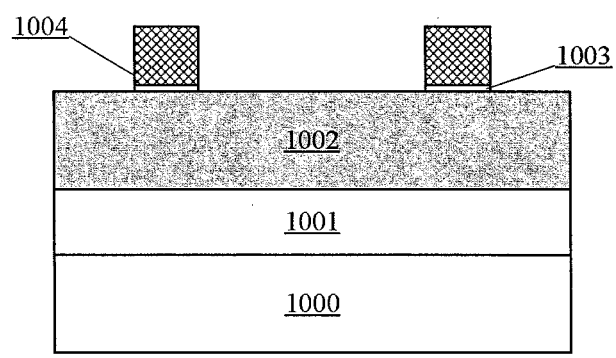

As shown in FIG. 12, after fins 1002 are formed and then a sacrificial gate dielectric layer 1003 and a sacrificial gate electrode layer 1004 are sequentially deposited on a semiconductor substrate, sacrificial gate lines 1004 are formed by printing a pattern of parallel gate lines and then carrying out etching, like the first embodiment. Usually, the sacrificial gate lines 1004 are made of poly silicon.

Figure 13:
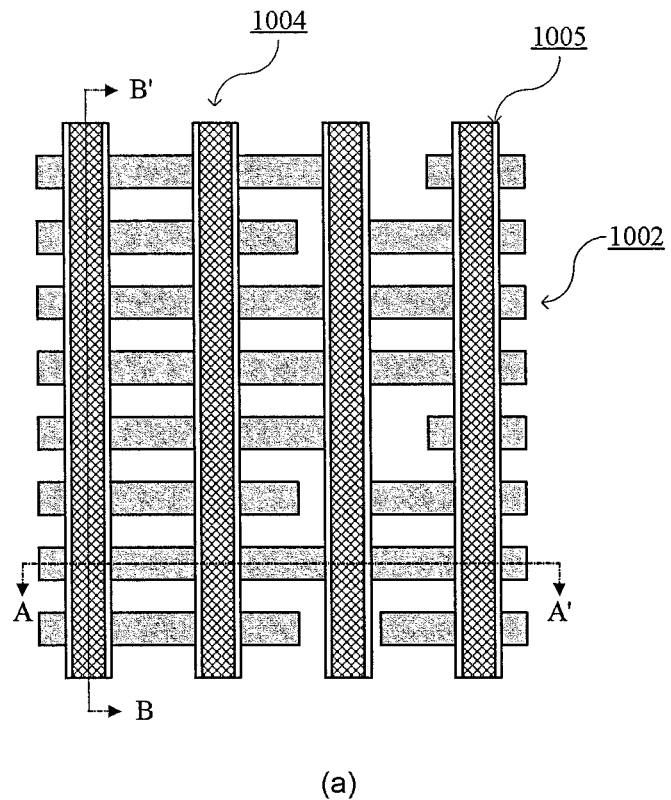
Figure 13:
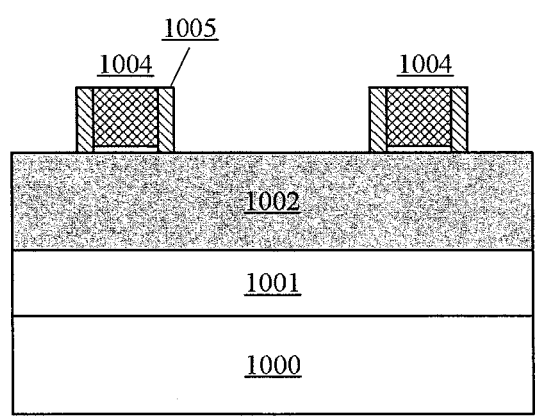

Then, the process continues as in the first embodiment. For example, as shown in FIG. 13, a dielectric spacer layer 1005 may be formed to surround the respective sacrificial gate lines 1004. Since there is no cut in the gate lines 1004, the dielectric spacer layer 1005 is formed on opposite lateral outer sides of the respective sacrificial gate lines 1004 in the horizontal direction of the figure, besides those formed at the ends of the sacrificial gate lines 1004 in the vertical direction. Next, an interlayer dielectric layer 1007 (referring to FIG. 11, but not shown here) may be formed on the resultant structure, and then planarized to expose the sacrificial gate lines. Generally, the interlayer dielectric layer may comprise nitride such as $Si_3N_4$. In this disclosure, optionally, to further improve the device performance, the interlayer dielectric layer may be made of a stressed dielectric material. For example, for a NFET, the interlayer dielectric layer may comprise a tensile-stressed dielectric material; and for a PFET, the interlayer dielectric layer may comprise a compressive-stressed dielectric material.

Figure 14:
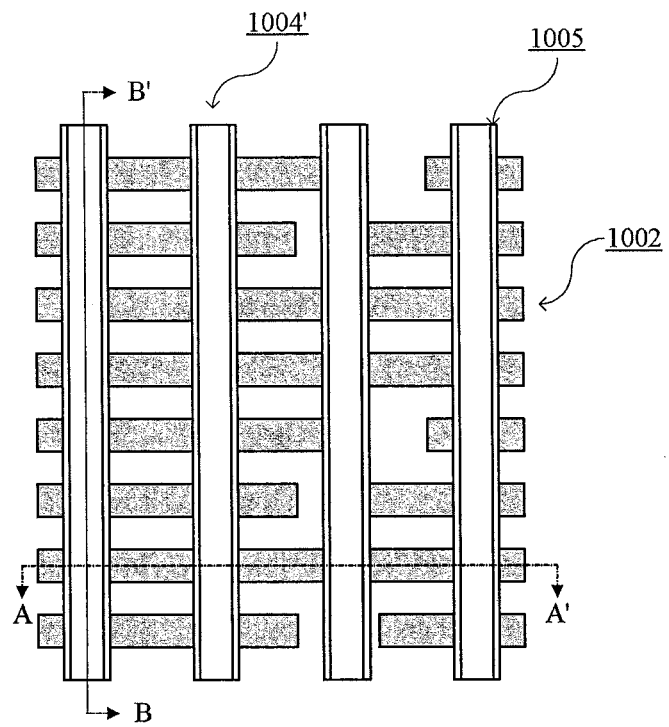
Figure 14:
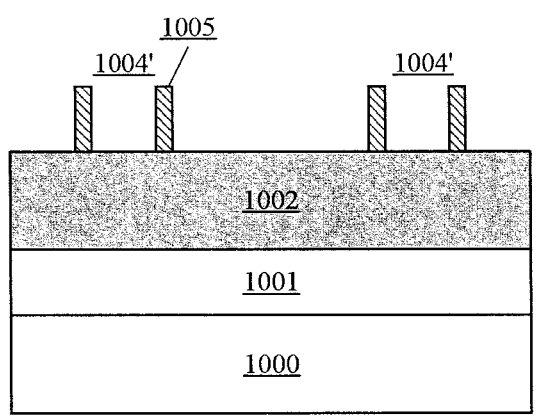
Figure 15:
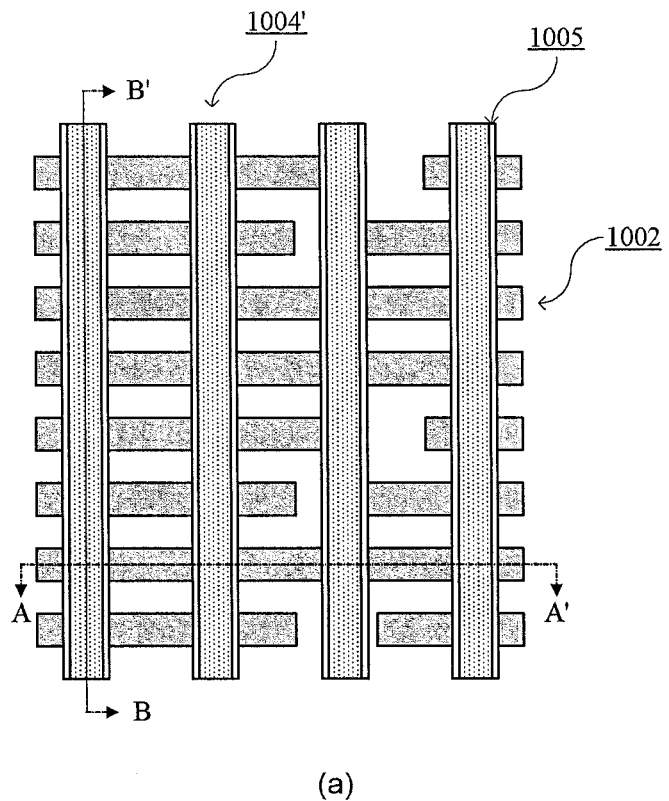
Figure 15:
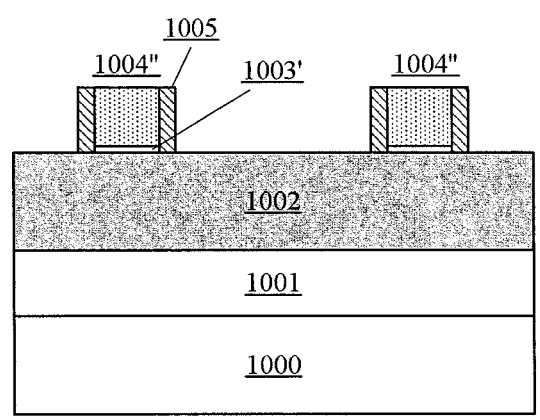

Subsequently, as shown in FIG. 14, the sacrificial gate lines 1004 and the sacrificial gate dielectric layer 1003 are removed by means of, for example, etching or the like, resulting in openings 1004' inside the dielectric spacer layer 1005. Then, as shown in FIG. 15, a replacement gate dielectric layer 1003' (for example, a high-K gate dielectric layer) and replacement gate lines 1004" (for example, metal gate lines) are formed in the openings 1004'. Those skilled in the art can devise various ways to implement the replacement process for the gate lines.

Next, electrical isolations between devices are performed at predetermined positions by means of a cut mask, like the first embodiment (referring to FIG. 11). Specifically, the electrical isolations can be performed by cutting off the replacement gate lines 1004", and optionally, also the dielectric spacer layer 1005, at the predetermined positions. Or alternatively, the electrical isolations can be performed by implanting oxygen species at the predetermined positions so that the material (for example, metal gate material) of the replacement gate lines 1004" is subjected to oxidation to form an insulating oxide.

Here, it should be noted that, although the replacement gate process is conducted before the cutting process in the above described embodiment, the present disclosure is not limited thereto. It is also feasible to conduct the cutting process before the replacement gate process. For example, the isolation process may be performed immediately after the dielectric spacer layer 1005 is formed, and then the replacement gate process is conducted to form the replacement gates. In a word, the sequences of the steps in various embodiments are not limited to those described above.

According to embodiments of the present disclosure, the electrical isolations (for example, cutting or oxidation) between the devices may be performed anytime after the dielectric spacer is formed, so as to finally complete the front end of line (FEOL) process for the semiconductor device structure. In other words, the isolation process may be performed after the formation of the dielectric spacer and before the formation of metal interconnections for the semiconductor device structure.

In the second embodiment, the dielectric spacer is formed as an "I" shaped spacer, which is different from the "D" shaped spacer in the first embodiment. The "I" shaped spacer has a benefit that it has the same height as the gate stacks so that the planarization process may be omitted. Those skilled in the art know various ways to form the "I" shaped spacer, and thus detailed descriptions thereof are omitted here. Also, the "I" shaped spacer is applicable to the first embodiment.

(Third Embodiment)

Hereinafter, a third embodiment is described with reference to FIGS. 16-18. According to the third embodiment, the above described method for forming the gate electrodes can be applied to formation of fins.

Figure 16:
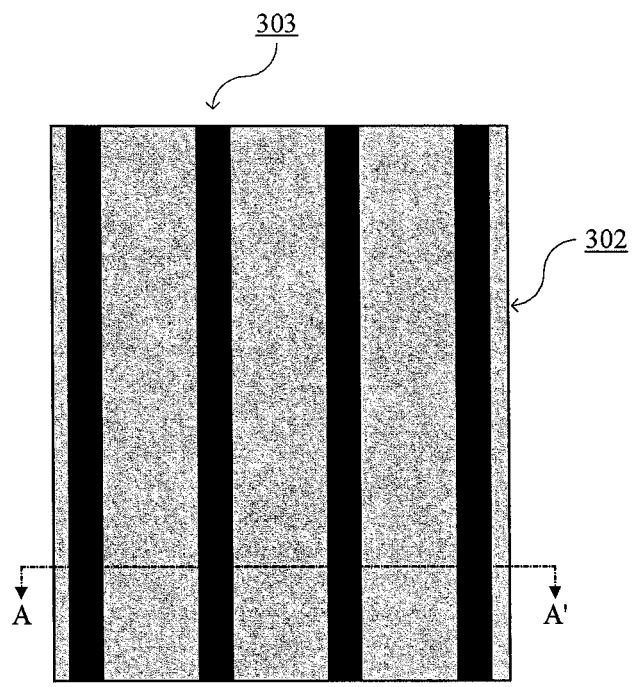
FIGS. 16-18 are diagrams schematically showing a process flow for manufacturing fins according to a third embodiment of the present disclosure, wherein (a) is a top view, (b) is a sectional view taken along line A-A' in (a).
Figure 16:
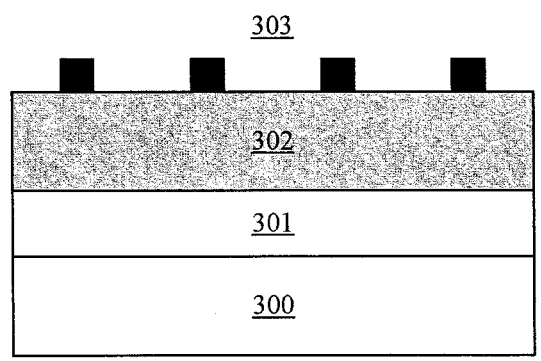

As shown in FIG. 16, firstly, a semiconductor substrate is provided. Likewise, an SOI substrate is provided here as an example. The SOI substrate comprises two Si layers 300 and 302 and also a SiO₂ layer 301 interposed therebetween. It should be understood by those skilled in the art that a substrate in other forms such as a bulk semiconductor substrate is also feasible. Then, a patterned hard mask layer 303 (for example, Si₃N₄) is formed on the semiconductor substrate.

Figure 17:
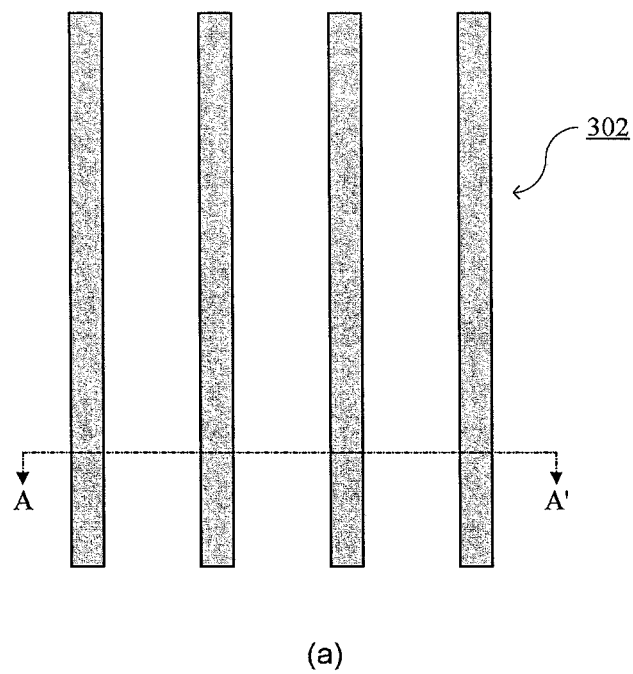
Figure 17:
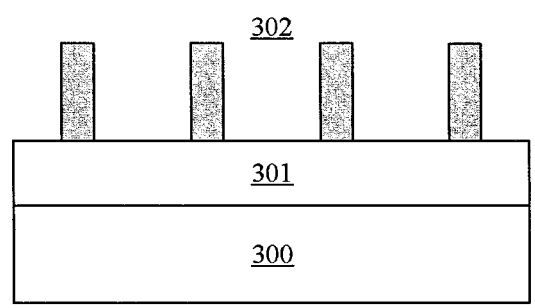

Next, as shown in FIG. 17, the Si layer 302 is etched with the hard mask layer 303 (for example, Si₃N₄) as a mask, to print parallel fin lines on the semiconductor substrate. Here, it should be noted that in FIG. 17(*a*) only the fin lines 302 on the semiconductor substrate are shown while other features are omitted for sake of clarity.

Figure 18:
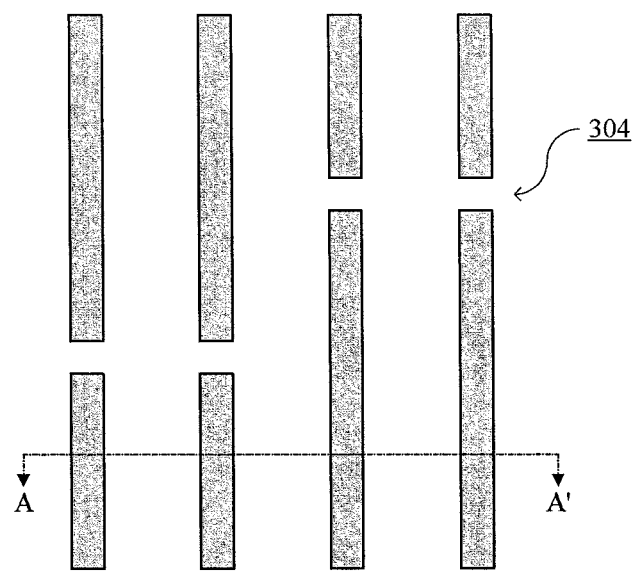
Figure 18:
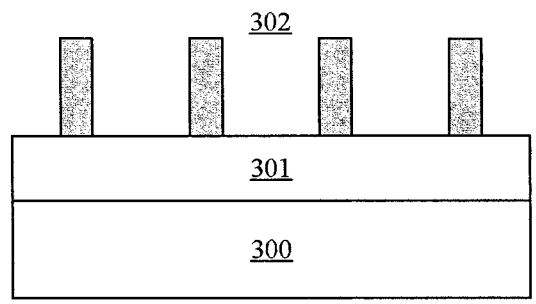

Then, as shown FIG. 18, a cutting process such as etching and oxidation is performed with a cut mask, to form isolated fins. These isolated fins serve as fins for respective devices.

As described above, in the embodiments of the present disclosure, the pattern of parallel lines will not be subjected to the inter-device electrical isolation process by means of the cut mask immediately after being printed on the substrate, unlike the conventional processes. Instead, etching is performed directly using the pattern of parallel lines to form the gate lines. Subsequently, the processes for forming the semiconductor device structure are performed. Finally, the inter-device electrical isolations are performed using the cut mask by means of, for example, cutting, oxidation, or the like. Therefore, according to the disclosed technology, the gate patterns are cut off or isolated at a later stage so that the ends of a pair of opposing gates can be closer to each other.

Further, in the present disclosure, the isolation process is conducted to isolate the devices from one another after the formation of the dielectric spacer. Therefore, there will be no spacer material remained between the ends of the opposing devices, and there will be no defects such as voids, unlike the conventional processes.

Furthermore, the present disclosure is compatible with the replacement gate process. Thus, it is possible to have various options for processes.

The mere fact that benefic measures described above in the different embodiments is not intended to mean that those measures cannot be used in combination to advantage.

In the above descriptions, details of patterning and etching of the layers are not described. It is understood by those skilled in the art that various measures may be utilized to form the layers and positions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A method for manufacturing a semiconductor device structure, comprising:
    forming a fin in a first direction on a semiconductor substrate;
    forming a gate line in a second direction, the second direction crossing the first direction on the semiconductor substrate, and the gate line intersecting the fin with a gate dielectric layer sandwiched between the gate line and the fin;
    forming a dielectric spacer surrounding the gate line; and
    performing inter-device electrical isolation at a predetermined position after forming the dielectric spacer, wherein isolated portions of the gate line form independent gate electrodes of respective devices.

2. The method according to claim 1, wherein the inter-device electrical isolation is performed by cutting off the gate line at the predetermined position.

3. The method according to claim 2, wherein the method further comprises cutting off the dielectric spacer at the predetermined position.

4. The method according to claim 1, wherein the inter-device electrical isolation is performed by converting a portion of the gate line at the predetermined position into an insulating material.

5. The method according to claim 4, wherein the inter-device electrical isolation is performed by implanting oxygen at the predetermined position and converting the portion of the gate line at the predetermined position into an isolating oxide.

6. The method according to claim 1, wherein the inter-device electrical isolation is performed after the dielectric spacer is formed and before metal interconnections of the semiconductor device structure are completed.

7. The method according to claim 1, wherein after the dielectric spacer is formed and before the inter-device electrical isolation is performed, the method further comprises:
    removing the gate line to form an opening inside the dielectric spacer; and
    forming a replacement gate line in the opening.

8. A semiconductor device structure, comprising:
    a semiconductor substrate;
    a plurality of devices formed on the semiconductor substrate, each of the devices comprising:
        a fin extending in a first direction;
        a gate electrode extending in a second direction, the second direction crossing the first direction, and the gate electrode intersecting the fin with a gate dielectric layer sandwiched between the gate electrode and the fin; and dielectric spacers on opposite side surfaces of the gate electrode extending in the second direction, a first electrical isolation at a predetermined position between adjacent devices, wherein the gate electrodes of respective devices adjacent to each other in the second direction are aligned to each other in the second direction, and the dielectric spacers of the respective devices adjacent to each other in the second direction are aligned to each other in the second direction;

and end surfaces of the dielectric spacers on the side surfaces of a first device, facing a second device adjacent to the first device in the second direction, are substantially flush with an end surface of the gate electrode of the first device facing the second device; and wherein adjacent gate electrodes in the second direction are formed from one gate line extending in the second direction, and the first electrical isolation comprises an insulating material converted from a portion of the gate line at the predetermined position.

9. The semiconductor device structure according to claim 8, wherein the first electrical isolation further extends through the dielectric spacer to isolate the dielectric spacers of the devices adjacent to each other in the second direction.

10. The semiconductor device structure according to claim 8, wherein adjacent gate electrodes in the second direction are formed from one gate line extending in the second direction, and the first electrical isolation comprises a cut in the gate line at the predetermined position, the cut being filled with a dielectric material.

11. The semiconductor device structure according to claim 10, wherein the cut further extends through the dielectric spacer layer.

12. The semiconductor device structure according to claim 8, wherein the insulating material comprises an oxide.

13. The semiconductor device structure according to claim 8, wherein the devices comprise a Fin Field Effect Transistor.

* * * * *